(12) United States Patent
Herbrandt et al.

(10) Patent No.: US 12,494,440 B2
(45) Date of Patent: Dec. 9, 2025

(54) POWER SEMICONDUCTOR MODULE AND METHOD OF INCREASING PIN ALIGNMENT ACCURACY FOR POWER SEMICONDUCTOR MODULES

(71) Applicant: Infineon Technologies AG, Neubiberg (DE)

(72) Inventors: Alexander Herbrandt, Soest (DE); Amir Al Kassou, Dormagen (DE)

(73) Assignee: Infineon Technologies AG, Neubiberg (DE)

( * ) Notice: Subject to any disclaimer, the term of this patent is extended or adjusted under 35 U.S.C. 154(b) by 380 days.

(21) Appl. No.: 18/326,543

(22) Filed: May 31, 2023

(65) Prior Publication Data

US 2024/0404961 A1    Dec. 5, 2024

(51) Int. Cl.
| | | |
|---|---|---|
| *H01L 23/544* | (2006.01) | |
| *H01L 21/66* | (2006.01) | |
| *H01L 23/053* | (2006.01) | |
| *H01L 23/498* | (2006.01) | |

(52) U.S. Cl.
CPC ............ *H01L 23/544* (2013.01); *H01L 22/20* (2013.01); *H01L 23/053* (2013.01); *H01L 23/49811* (2013.01); *H01L 2223/54413* (2013.01); *H01L 2223/54426* (2013.01)

(58) Field of Classification Search
None
See application file for complete search history.

(56) References Cited

U.S. PATENT DOCUMENTS

| | | | |
|---|---|---|---|
| 2008/0079129 A1* | 4/2008 | Ganapathysubramanian | ............. H01L 23/34 438/106 |
| 2013/0234312 A1* | 9/2013 | Suzuki | .................... H01L 24/92 438/107 |
| 2016/0372392 A1 | 12/2016 | Sakamoto | |
| 2019/0164901 A1* | 5/2019 | Liu | ......................... H01L 25/50 |
| 2020/0176351 A1 | 6/2020 | Garg et al. | |

FOREIGN PATENT DOCUMENTS

DE    102013100701 A1    7/2014

OTHER PUBLICATIONS

"Infineon—AN2009-0—Assembly instructions for the Easy PressFIT modules", Jan. 14, 2022, pp. 1-33.

* cited by examiner

*Primary Examiner* — Bilkis Jahan
(74) *Attorney, Agent, or Firm* — Murphy, Bilak & Homiller, PLLC

(57) ABSTRACT

A method of increasing overall pin alignment accuracy for a power semiconductor module is provided. The power semiconductor module has a plurality of pins protruding from a housing of the power semiconductor module. The method includes: determining a positional deviation of each pin of the plurality of pins from a respective target position in a coordinate system; determining a positional offset for the power semiconductor module based on the positional deviations of the pins, the positional offset reducing overall misalignment between the plurality of pins and the target positions; and encoding the positional offset on an exposed surface of the power semiconductor module. Methods of mounting the power semiconductor module to a circuit board and/or heat sink are also provided.

21 Claims, 12 Drawing Sheets

POWER SEMICONDUCTOR MODULE AND METHOD OF INCREASING PIN ALIGNMENT ACCURACY FOR POWER SEMICONDUCTOR MODULES

BACKGROUND

Power semiconductor modules typically have a current rating between 6 A and 3600 A (or higher) cover a power range from hundreds of watts to several megawatts, and have wide adoption across many applications such as general purpose drives, traction, servo-units, renewable energy applications like solar inverters or wind applications, hybrid electric and full electric vehicle applications, etc. The electrical connection interface for power semiconductor modules typically includes contact pins that provide an electrical interface between the power semiconductor dies housed in the electrically insulative enclosure of the module and a circuit board with additional electronic components.

Accurate alignment of the module pins with corresponding openings in the circuit board is necessary to avoid pin and/or board damage during the module mounting process. This typically involves optical detection of the pin tip positions during the module mounting process. Optically scanning the pin tips to determine pin tip position is a complex and slow process, especially for a high number of pins, and dedicated optical inspection equipment and corresponding know-how is required to implement pin tip recognition. Another approach is for a human operator to manually press fit each power semiconductor module to the respective circuit board, which is labor intensive and slow.

SUMMARY

According to an embodiment of a method of increasing overall pin alignment accuracy for a power semiconductor module having a plurality of pins protruding from a housing of the power semiconductor module, the method comprises: determining a positional deviation of each pin of the plurality of pins from a respective target position in a coordinate system; determining a positional offset for the power semiconductor module based on the positional deviations of the pins, the positional offset reducing overall misalignment between the plurality of pins and the target positions; and encoding the positional offset on an exposed surface of the power semiconductor module.

According to an embodiment of a method of mounting a power semiconductor module having a plurality of pins protruding from a housing of the power semiconductor module, the method comprises: deciphering a positional offset encoded on the exposed surface of the power semiconductor module, the positional offset reducing overall misalignment between the plurality of pins and target positions for the pins; securing the power semiconductor module by automated equipment; adjusting a pressing position of the automated equipment in relation to a circuit board, based on the deciphered positional offset; and after adjusting the pressing position, pressing the plurality of pins into respective openings in the circuit board via the automated equipment.

According to an embodiment of a power semiconductor module, the power semiconductor module comprises: a plurality of power semiconductor dies attached to a substrate; a housing secured to the substrate and enclosing the plurality of power semiconductor dies; a plurality of pins protruding from the housing; and a positional offset encoded on the exposed surface of the power semiconductor module, the positional offset reducing overall misalignment between the plurality of pins and target positions for the pins.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

According to embodiments described herein, a positional offset is encoded on an exposed surface of a power semiconductor module that reduces overall misalignment between the module pins and target positions for the pins. A method of increasing overall pin alignment accuracy for the power semiconductor module and a method of mounting the power semiconductor module to a circuit board and/or a heat sink are also described. The encoded positional offset can be used to adjust a pressing position of automated equipment in relation to a circuit board, to reduce overall misalignment between the module pins and corresponding openings (apertures) in a circuit board when the automated equipment presses the module pins into the board openings. By encoding the positional offset on an exposed surface of the power semiconductor module, the individual pin tip positions do not need to be optically scanned during the module mounting process. Instead, the encoded positional offset simply needs to be ascertained from the exposed surface of the power semiconductor module and deciphered to determine an optimal pressing position for the power semiconductor module.

Described next, with reference to the figures, are exemplary embodiments of the power semiconductor module with the encoded positional offset and methods of mounting the power semiconductor module. Any of the power semiconductor module and method embodiments described herein may be used interchangeably unless otherwise expressly stated.

Figure 1:
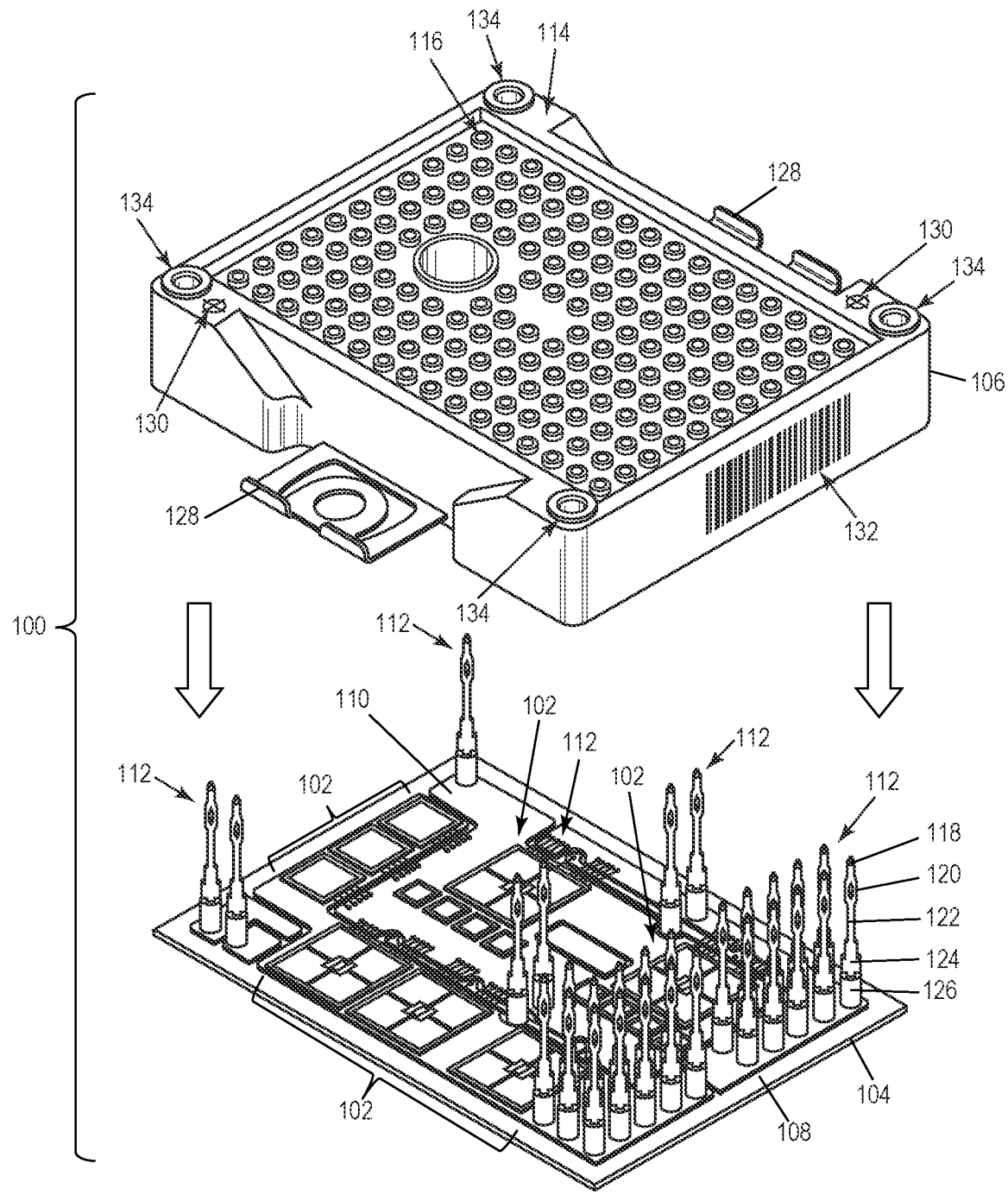
FIG. 1 illustrates an exploded view of a power semiconductor module having an encoded positional offset that increases overall pin alignment accuracy for the module.

FIG. 1 illustrates an exploded view of a power semiconductor module 100. The power semiconductor module 100 may form part of a power electronics circuit for use in various power applications such as a DC/AC inverter, a DC/DC converter, an AC/DC converter, a DC/AC converter, an AC/AC converter, a multi-phase inverter, an H-bridge, motor drive, etc. The power semiconductor module 100 includes power semiconductor dies 102 attached to a substrate 104. An electrically insulative housing 106 is secured to the substrate 104 as indicated by the downward facing arrows in FIG. 1, and encloses the power semiconductor dies 102. In the case of a plastic housing 106, the housing 106 may be secured to the substrate 104 by an adhesive, plastic cement, etc.

The substrate 104 may be, e.g., a DCB (direct copper bonded) substrate, an AMB (active metal brazed) substrate, an IMS (insulated metal substrate), etc. In the case of DCB, AMB, or IMS substrate technologies, the substrate 104 may include a ceramic body 108 with a patterned metallization 110 on the frontside of the ceramic body 108 and to which the power semiconductor dies 102 are attached, e.g., by solder, sintering, an adhesive, etc.

The power semiconductor dies 102 may be electrically contacted at the backside by the patterned metallization 110 of the substrate 104 and at the frontside by bond wires 112, metal clips (not shown), etc. The power semiconductor dies 102 may include power Si or SiC power MOSFET (metal-oxide-semiconductor field-effect transistor) dies, HEMT (high-electron mobility transistor) dies, IGBT (insulated-gate bipolar transistor) dies, JFET (junction filed-effect transistor) dies, power diode dies, etc. Some or all of the power semiconductor dies 102 may be, e.g., vertical power transistor dies. For a vertical power transistor die, the primary current flow path is between the front and back sides of the die. The drain pad is typically disposed at the backside of the die, with the gate and source pads (and optionally one or more sense pads) at the frontside of the die. Additional types of semiconductor dies may be included in the power semiconductor module 100, e.g., such as one or more logic dies, controller dies, gate driver dies, etc.

The power semiconductor module 100 also includes pins 112 that protrude from the housing 106. The pins 112 are attached to the substrate 104 and/or another structure such as a metallic lead frame or clip frame enclosed by the housing 106, and protrude through a first side 114 of the housing 106 to form an electrical connection interface outside the housing 106. The pins 112 extend through openings 118 in the first side 114 of the housing 106.

In one embodiment, the pins 112 are press-fit pins, The term 'press-fit' as used herein refers to a pin geometry that enables plastic and/or elastic deformation in an upper region of the pins 112 when the pins 112 are inserted into corresponding openings of a circuit board (not shown in FIG. 1) such as a PCB (printed circuit board) or other type of component, providing effective contact points within the contact zone. The contact radius increases due to the contact pressure since the macroscopic contact force concentrates on a microscopic contact area. Accordingly, the pin face and the metallized face of the opening of the circuit board merge, i.e., are cold welded. Such a press-fit connection increases the effective contact zone and may provide a gas-tight contact zone that is robust against corrosive environments.

In the case of press-fit pins 112, the pins 112 include a tip part 118 configured to guide the press-fit pin 112 into a respective opening of a circuit board. A deformable part 120 adjoins the tip part 118 and is configured to plastically and/or elastically deform upon insertion into the corresponding circuit board opening. An elongate part 122 adjoins the deformable part 120 and has a length that may be chosen to accommodate the thickness (height) of the module housing 106 through which the press-fit pin 112 protrudes. A base part 124 adjoins the elongate part 122 and may be the widest part of the press-fit pin 112 to accommodate a force applied to the base part 124 for pressing the pin 112 into a sleeve 126 attached to the substrate 104. An anchoring part (out-of-view in FIG. 1) adjoins the base part 124 and is received by the corresponding sleeve 126.

Part of a metallic lead frame or clip frame included (not shown in FIG. 1) in the power semiconductor module 100 may protrude through one or more side faces of the housing 106 to form a power terminal which may provide a reference voltage to the power semiconductor module 100 or carry current to or from the power semiconductor module 100. The electrical connection interface formed by the pins 112 provides an electrical interface to the power semiconductor dies 102 enclosed by the housing 106. As explained above, the pins 112 may have a pin geometry that enables plastic and/or elastic deformation of a deformable part 120 of the pins 112 upon insertion of the tip-end 118 of the pins 112 into corresponding openings of a circuit board. One or more metallic tabs 128 or similar anchoring structures may protrude from the housing 106 to provide an anchoring point for securing the power semiconductor module 100 to a heat sink (not shown in FIG. 1).

Figure 2B:
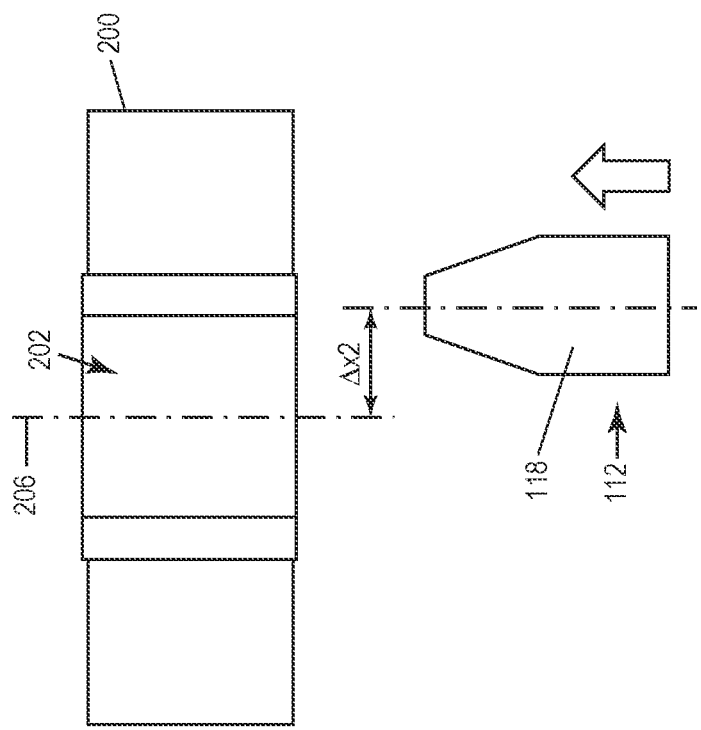
FIGS. 2A and 2B illustrate two different pin alignment scenarios for the power semiconductor module.
Figure 2A:
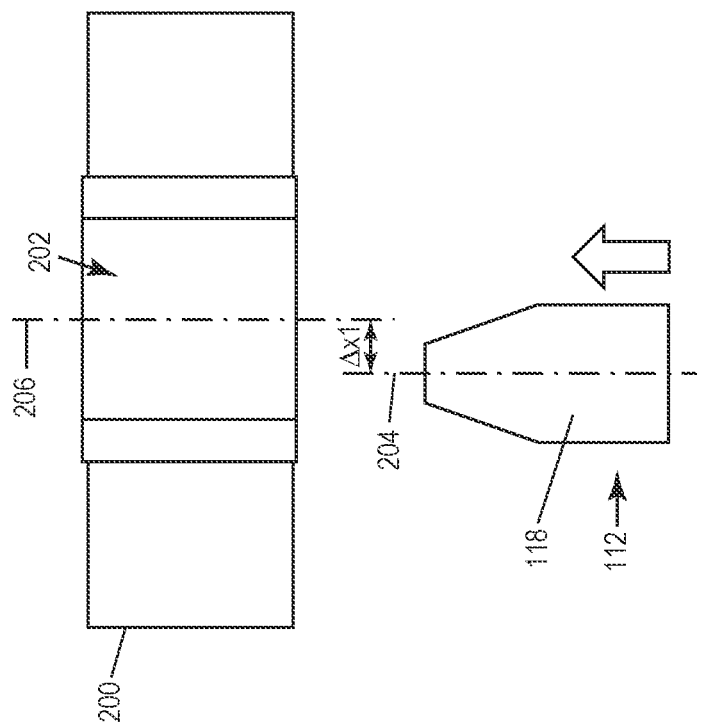

FIGS. 2A and 2B illustrate two different pin alignment scenarios for the power semiconductor module 100. During mounting of the power semiconductor module 100 to a circuit board 200 such as a PCB, all module pins 112 should be received by respective (apertures) openings 202 in the circuit board 200. In FIG. 2A, the vertical centerline 204 of the illustrated pin tip 118 is offset from the vertical centerline 206 of the corresponding circuit board opening 202 but by an acceptable amount Δx1. Accordingly, the pin 112 in FIG. 2A is properly received by the corresponding circuit board opening 202 during press fitting of the power semiconductor module 100.

In FIG. 2B, the vertical centerline 204 of the illustrated pin tip 118 also is offset from the vertical centerline 206 of the corresponding circuit board opening 202 by an amount Δx2 that is outside the permitted alignment tolerance. Accordingly, the pin 112 in FIG. 2B is not received by the corresponding circuit board opening 202 during press fitting of the power semiconductor module 100 which results in damage to the pin 112 and/or circuit board 200.

To avoid the misalignment issue illustrated in FIG. 2B, a positional offset is encoded on an exposed surface of the power semiconductor module 100. The positional offset reduces the overall misalignment between the pins 112 and target positions for the pins 112. The encoded positional offset can be used to adjust a pressing position of automated equipment (not shown in FIGS. 2A and 2B) in relation to the circuit board 200, to reduce overall misalignment between the module pins 112 and corresponding openings 202 in the circuit board 200 when the automated equipment presses the module pins 112 into the board openings 202 as indicated by the upward facing arrows in FIGS. 2A and 2B.

FIG. 1 illustrates different embodiments of the positional offset encoded on an exposed surface of the power semiconductor module 100. For example, the positional offset may include one or more fiducial marks 130 indicative of the positional offset. Each fiducial mark 130 is decipherable by an imaging system and may be used as a point of reference for adjusting the position (X, Y and/or rotational) of the power semiconductor module 100 during module mounting to ensure pin alignment accuracy. In another example, the positional offset may include a barcode 132 indicative of the positional offset. The barcode 132 may be (linear) one-dimensional or (matrix) two-dimensional. The barcode 132 is decipherable by a barcode reader system and may be used to indicate a positional (X, Y and/or rotational) shift for the power semiconductor module 100 during module mounting to ensure pin alignment accuracy.

Figure 16:
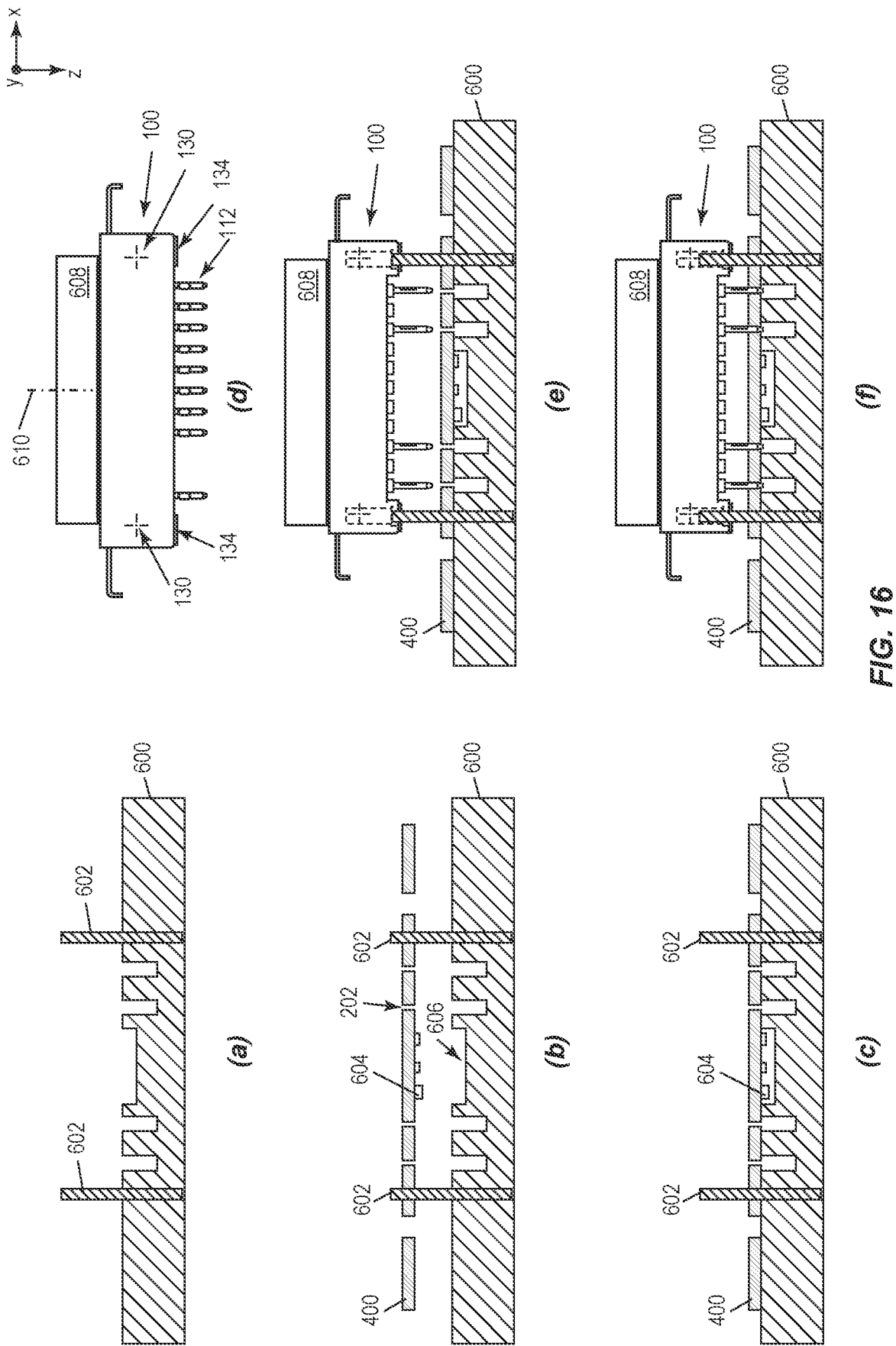
FIG. 16 illustrates an embodiment of a method of mounting the power semiconductor module to a circuit board using automated press tool equipment.

The barcode 132 may relate the positional offset to a plurality of mounting regions 134 of the housing 106. The mounting regions 106 are configured to enable mounting of the housing 106 to a body such a circuit board, heat sink, etc. For example, the mounting regions 106 may be used to locate the module housing during PCB installation (e.g., as shown in FIG. 16) and may also be used after PCB installation, e.g., to secure the PCB to the housing 106 with screws, for example. In each case, alignment instructions indicated by the positional offset may be encoded in the barcode 132 such that the barcode 132 relates the positional offset to the mounting regions 134 of the housing 106. The barcode 132 may instead relate the positional offset to other features already present on the housing 106, e.g., such as pegs or through holes. In each of these examples, the fiducial mark 130 is not necessary to implement the alignment instructions indicated by the positional offset.

In each case, the positional offset encoded on an exposed surface of the power semiconductor module 100 reduces overall misalignment between the module pins 112 and target positions for the module pins 112. For example, during mounting of the power semiconductor module 100 to the circuit board 200 shown in FIGS. 2A and 2B, the positional offset may be deciphered and used to adjust a pressing position of automated equipment (not shown in FIGS. 2A and 2B) in relation to the circuit board 200 such that all pins 112 of the power semiconductor module 100 are received by the respective openings 202 in the circuit board 200.

Figure 3:
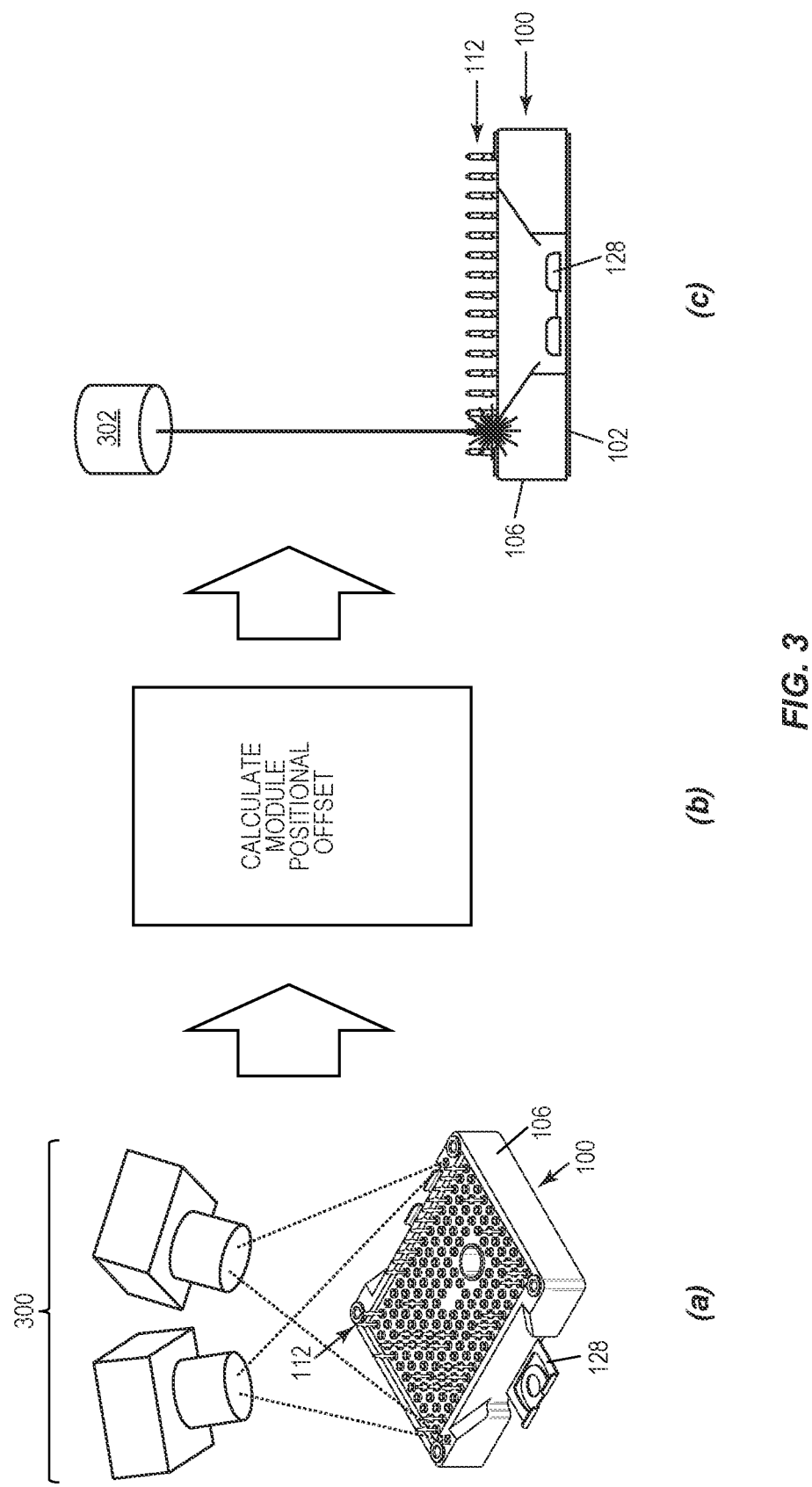
FIG. 3 illustrates an embodiment of increasing overall pin alignment accuracy for the power semiconductor module by encoding a positional offset on an exposed surface of the module.

FIG. 3 illustrates an embodiment of increasing overall pin alignment accuracy for the power semiconductor module 100 by encoding the positional offset on an exposed surface of the power semiconductor module 100. In step (a), equipment 300 such as optical scanning equipment and a corresponding computer interface is used to determine a positional deviation of each module pin 112 from a respective target position in a coordinate system. The equipment 300 determines the position of each pin 112, e.g., by optical scanning and uses the pin position information to determine whether the pin 112 has any positional deviation from the respective target position in the coordinate system.

Figure 4:
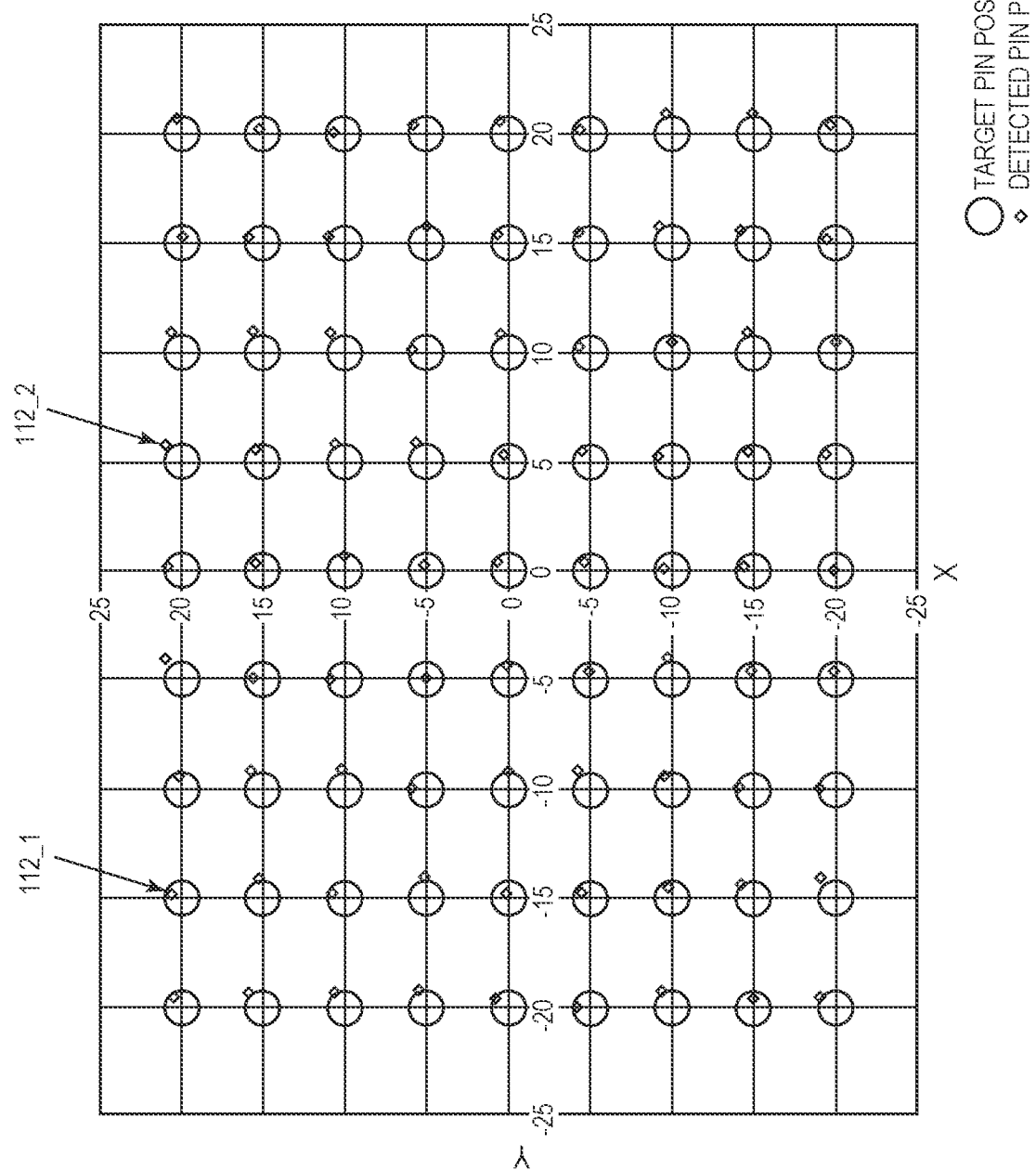
FIG. 4 illustrates a Cartesian coordinate system used as the coordinate system to determine the positional deviation of each module pin from a respective target position.

FIG. 4 illustrates a Cartesian coordinate system as the coordinate system used to determine the positional deviation of each module pin 112 from the respective target position. According to this embodiment, the computer interface of the equipment 300 calculates an X offset for each pin 112 that has a detected position that differs from the corresponding target position in the X axis of the Cartesian coordinate system. The equipment 300 also calculates a Y offset for each pin 112 that has a position that differs from the corresponding target position in the Y axis of the Cartesian coordinate system.

As shown in FIG. 4, the detected position of some pins 112_1 may be within the corresponding target position whereas the detected position of other pins 112_2 may be outside the corresponding target position. The openings 116 in the module housing 106 are typically large enough to accommodate greater pin position tolerance than the openings 202 in the circuit board. Each module pin 112_2 that has a detected position outside the corresponding target position in FIG. 4 most likely will not be received by the corresponding opening 202 in the circuit board 200 absent some positional adjustment of the power semiconductor module 100, at least in the case of automated press fitting.

To mitigate this issue, step (b) in FIG. 3 involves determining a positional offset for the power semiconductor module 100 based on the positional deviations of the individual pins 112. In one embodiment, a best fit position of all pins 112 is determined for the power semiconductor module 100. Best fit is a fitting process that determines the best fit to a series of data points. In this case, the data points are the positional deviations of the individual module pins 112 and the fitting criteria ensures all module pins 112 are within the respective target positions. If a best fit solution is not possible, then the power semiconductor module is reworked or discarded.

Figure 5:
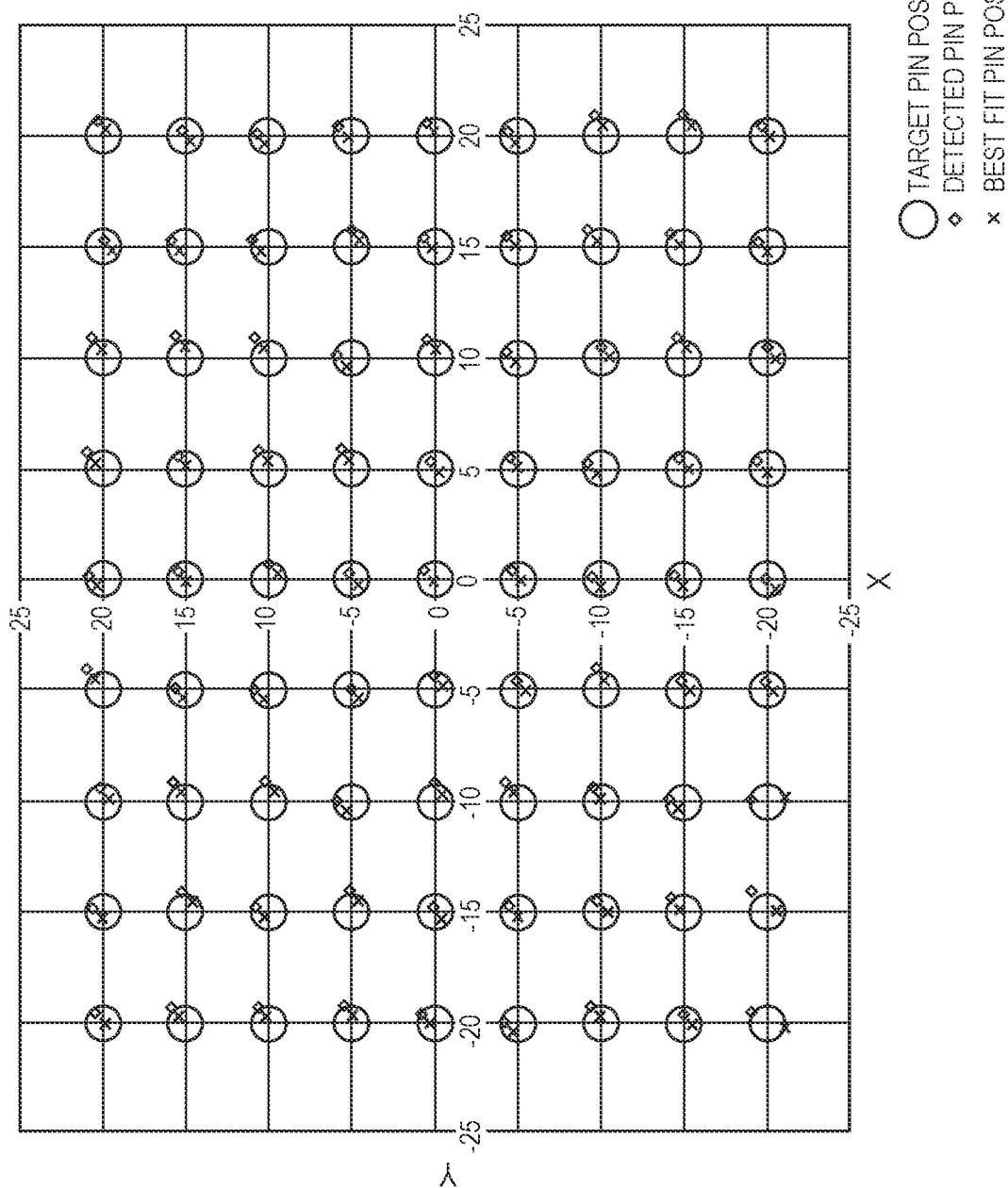
FIG. 5 illustrates the positional offset for the power semiconductor module within the Cartesian coordinate system, by calculating the positional offset based on the X and Y offsets calculated for the pins.

FIG. 5 illustrates the positional offset for the power semiconductor module 100 within the Cartesian coordinate system, by calculating the positional offset based on the X and Y offsets calculated for the pins 112. The calculated best fit reduces overall misalignment between the module pins 112 and the target positions. As shown in FIG. 5, the best fit positional offset indicates a positional shift of the power semiconductor module 100 in the X direction and/or the Y direction that ensures overall better alignment of the pins 112 with the target positions. Separately or in combination, the positional offset may indicate a rotational shift of the power semiconductor module 100.

As is evident by comparing FIGS. 4 and 5, the positional offset for the power semiconductor module 100 may result in one or more individual pins 112 having a larger but still acceptable X and/or Y offset with the corresponding target position. However, overall pin alignment for the power semiconductor module 100 is increased and the positional offset yields a collective best fit since all pins 112 fall within the target positions by applying the positional offset.

Step (C) in FIG. 3 involves encoding the positional offset on an exposed surface of the power semiconductor module 100. In FIG. 3, the encoding is performed by laser equipment 302 that laser marks one or more fiducial marks 130 or a barcode 132 indicative of the positional offset on an exposed surface of the power semiconductor module 100. The laser equipment 302 instead may be ink jet printing equipment that ink jet prints one or more fiducial marks 130 or a barcode 132 indicative of the positional offset on an exposed surface of the power semiconductor module 100. In still another embodiment, the laser equipment 302 instead may be mechanical scribe equipment that scribes (cuts or scratches) one or more fiducial marks 130 or a barcode 132 indicative of the positional offset on an exposed surface of the power semiconductor module 100.

FIGS. 6 through 15 illustrate different embodiments of the positional offset encoded on an exposed surface of the power semiconductor module 100. In FIGS. 6 through 15, the positional offset is shown encoded as one or more fiducial marks 130. Instead, the positional offset may be encoded as a barcode 130 or any other form suitable to convey the positional offset information.

Figure 6:
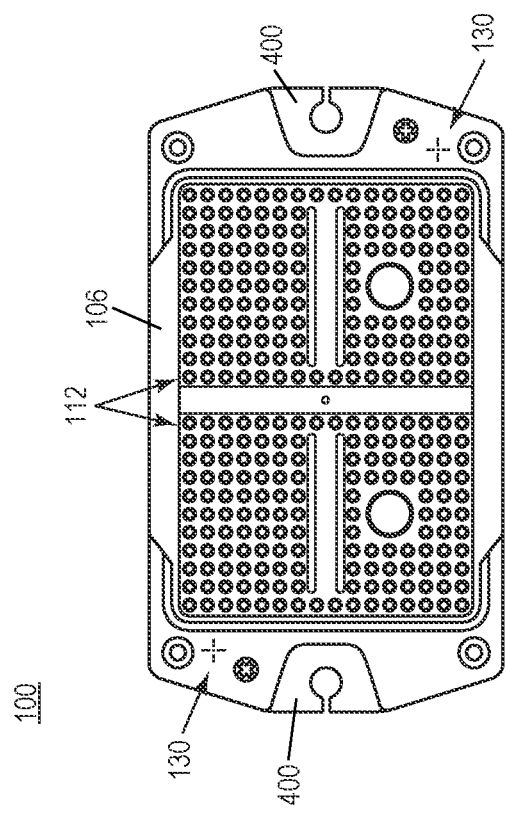

FIG. 6 illustrates a top plan view of the power semiconductor module 100. According to this embodiment, the positional offset is encoded on an exposed front surface of the module housing 106.

Figure 7:
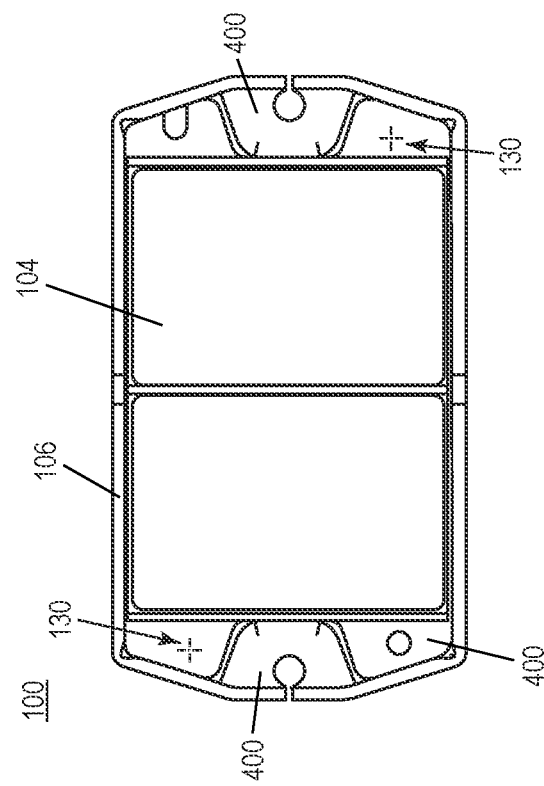
FIGS. 6 through 15 illustrate different embodiments of the positional offset encoded on an exposed surface of the power semiconductor module.

FIG. 7 illustrates a bottom plan view of the power semiconductor module 100. According to this embodiment, the positional offset is encoded on an exposed back surface of the module 100. For example, the positional offset may be encoded on the substrate 104, a metallic baseplate 400, or the housing 106 at the backside of the module 100.

Figure 8:
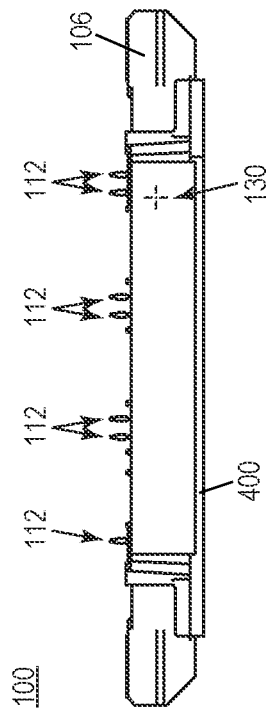

FIG. 8 illustrates a side view of the power semiconductor module 100. According to this embodiment, the positional offset is encoded on an exposed side surface of the module housing 106.

Figure 9:
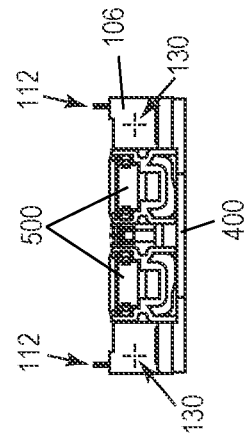

FIG. 9 illustrates an end view of the power semiconductor module 100. According to this embodiment, the positional offset is encoded on an exposed end surface of the module housing 106. Also in this embodiment, the power semiconductor module 100 has one or more metallic bus bars 500 for providing a reference voltage to the power semiconductor module 100 and/or carrying current to or from the power semiconductor module 100.

Figure 10:
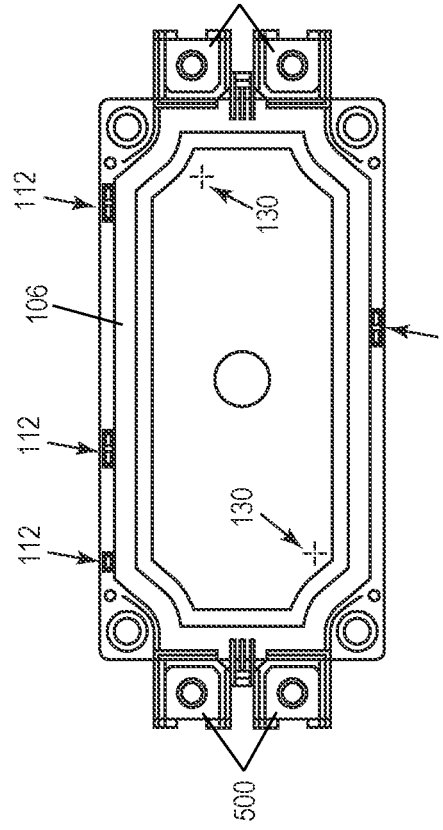

FIG. 10 illustrates a top plan view of the power semiconductor module 100. According to this embodiment, the positional offset is encoded on an exposed front surface of the module housing 106 and the module 100 has one or more metallic bus bars 500 for providing a reference voltage to the power semiconductor module 100 and/or carrying current to or from the power semiconductor module 100.

Figure 11:
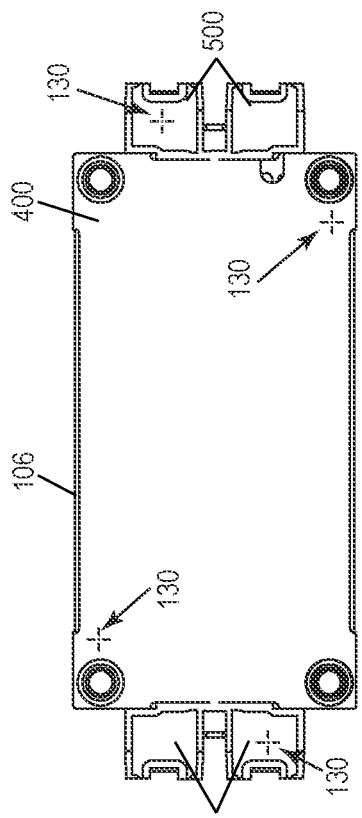

FIG. 11 illustrates a bottom plan view of the power semiconductor module 100. According to this embodiment, the positional offset is encoded on an exposed back surface of the metallic baseplate 400 and the module 100 has one or more metallic bus bars 500 for providing a reference voltage to the power semiconductor module 100 and/or carrying current to or from the power semiconductor module 100. Separately or in combination, the positional offset may be encoded on an exposed back surface of one or more of the metallic bus bars 500.

Figure 12:
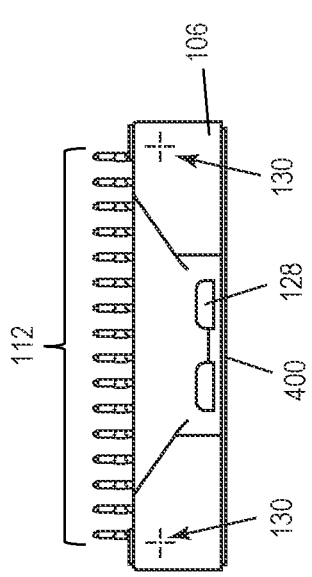

FIG. 12 illustrates an end view of the power semiconductor module 100. According to this embodiment, the positional offset is encoded on an exposed end surface of the module housing 106.

Figure 13:
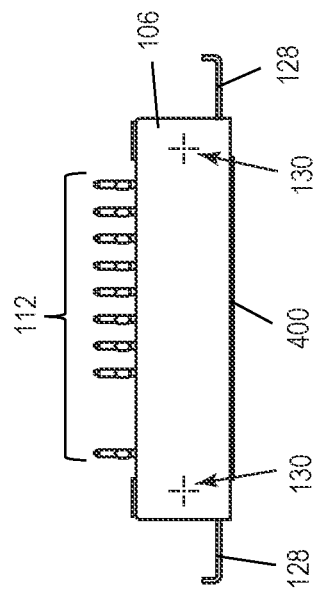

FIG. 13 illustrates a side view of the power semiconductor module 100. According to this embodiment, the positional offset is encoded on an exposed side surface of the module housing 106.

Figure 14:
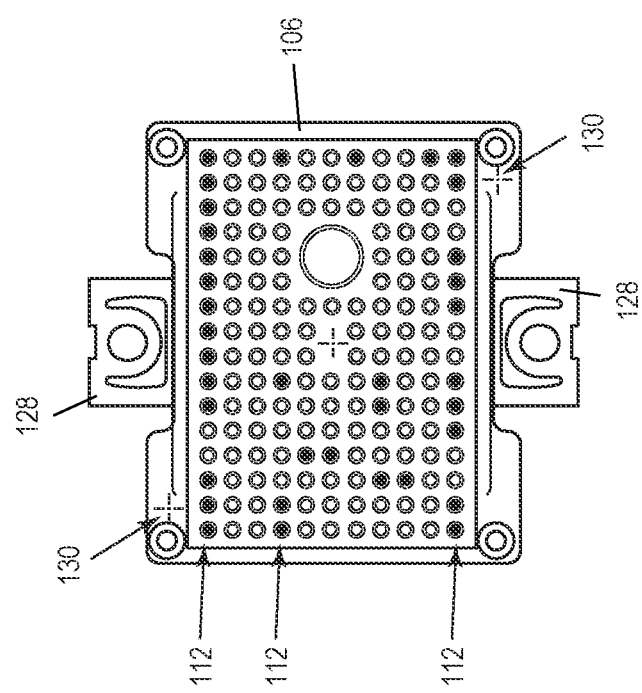

FIG. 14 illustrates a top plan view of the power semiconductor module 100. According to this embodiment, the positional offset is encoded on an exposed front surface of the module housing 106.

Figure 15:
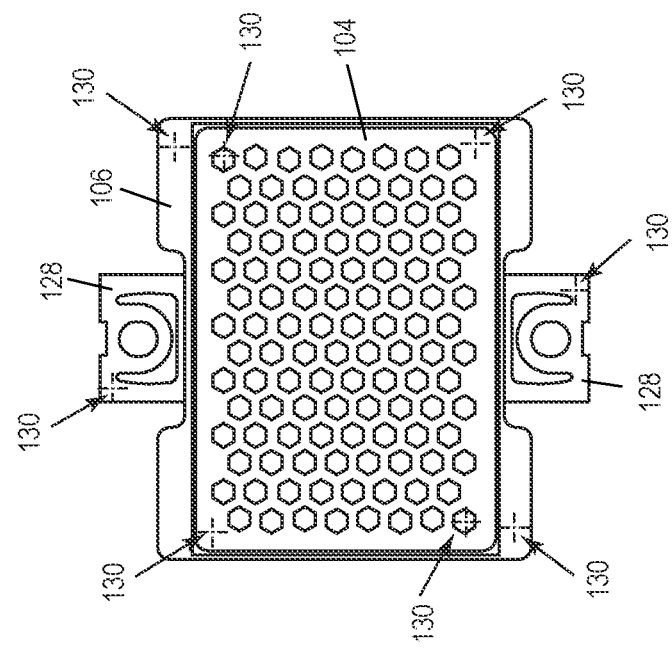

FIG. 15 illustrates a bottom plan view of the power semiconductor module 100. According to this embodiment, the positional offset is encoded on an exposed back surface of the module 100. For example, the positional offset may be encoded on an exposed back surface of the module housing 106. Separately or in combination, the positional offset may be encoded on an exposed metallized back surface of the module substrate 104 which may or may not be patterned. Separately or in combination, the positional offset may be encoded on an exposed back surface of the metallic tab(s) 128 provided for anchoring the module 100 to a heat sink (not shown in FIG. 15).

FIG. 16 illustrates an embodiment of a method of mounting the power semiconductor module 100 to a circuit board 200 using automated press tool equipment. In step a), the automated press tool equipment is prepared for press fitting of the power semiconductor module 100 to the circuit board 200. The automated press tool equipment includes a base 600 that may include guide domes or posts 602 for pre-alignment purposes. In step b), the circuit board 400 is placed into the automated press tool equipment. The guide domes or posts 602 of the press tool base 600 may be used to ensure correct placement of the circuit board 400. Circuit components 604 may be mounted to the circuit board 400. In this case, the press tool base 600 may have one or more recesses 606 for receiving the circuit components 604 during the press fitting. In step c), the automated press tool equipment presses the circuit board 400 against the press tool base 600.

In step d), a moveable part 608 of the automated press tool equipment secures the power semiconductor module 100. The positional offset for the power semiconductor module 100 is encoded on an exposed surface of the module 100. In FIG. 16, the positional offset is shown encoded as fiducial marks 130. Instead, the positional offset may be encoded as a barcode 130 or any other form suitable to convey the positional offset information. The automated press tool equipment deciphers the positional offset, e.g., by optical imaging. If a barcode 132 or other type of encoding is used, the automated press tool equipment decodes the encoded information to decipher the positional offset. In the case of fiducial marks 130, the fiducial marks 130 directly indicate the positional offset.

In each case, the automated press tool equipment adjusts the pressing position of the moveable tool part 608 in relation to the circuit board 400, based on the deciphered positional offset. The pressing position of the moveable tool part 608 may be adjusted in the X direction, Y direction and/or along a rotational axis 610 that is parallel to the pressing direction Z. After adjusting the pressing position of the moveable tool part 608, the of the moveable tool part 608 presses the module pins 112 into the respective openings 202 in the circuit board 200. In step e), this may involve placing the power semiconductor module 100 on the guide domes or posts 602 of the press tool base 600. The power semiconductor module 100 may then be released and the module pins 112 inserted into the corresponding openings 202 in the circuit board 200. Step f) shows the module pins 112 being inserted into the circuit board openings 202. In the case of press-fit pins, the deformable part 120 of the module pins 112 plastically and/or elastically deform upon insertion into the circuit board openings 202.

Figure 17:
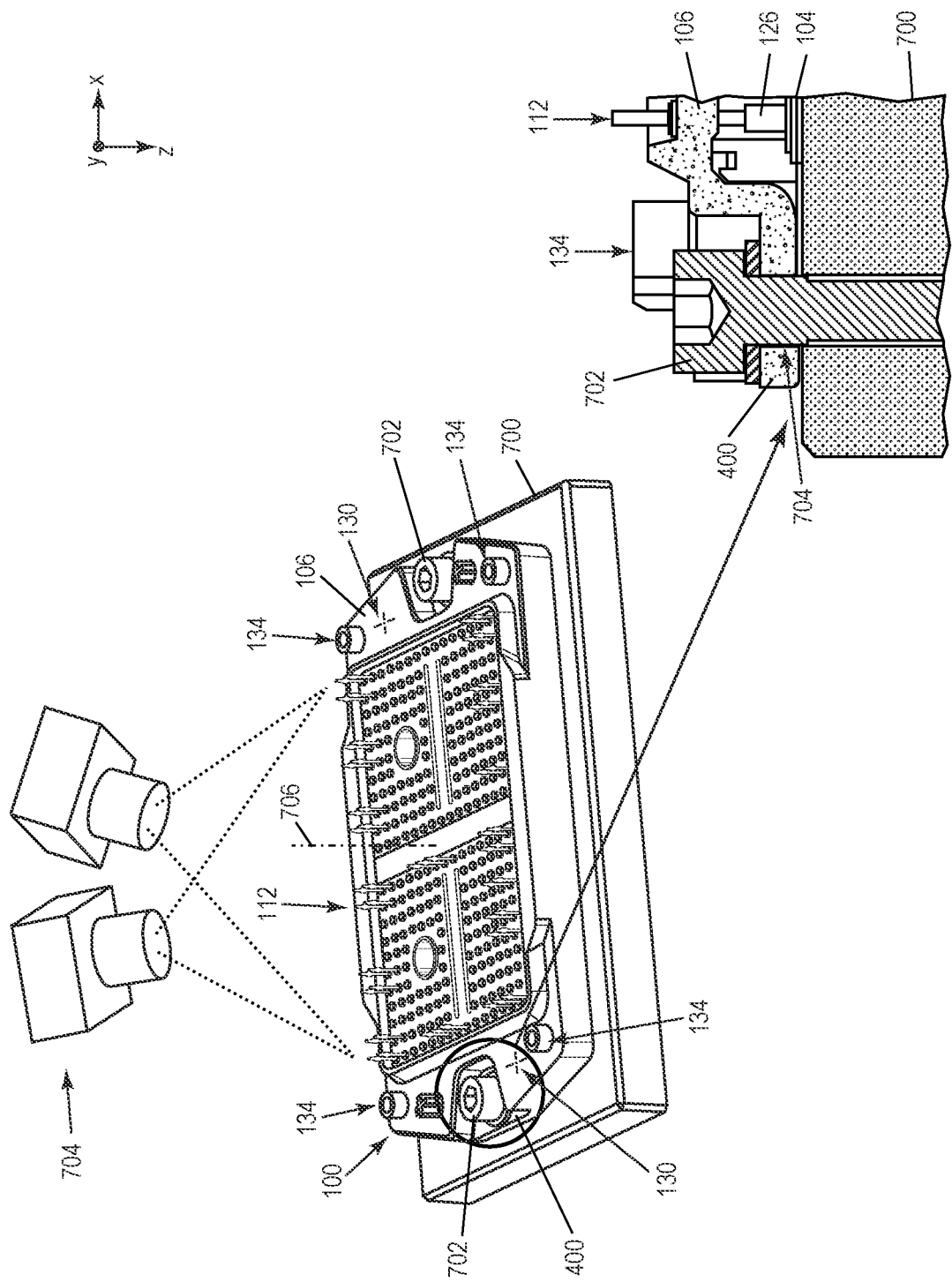
FIG. 17 illustrates an embodiment of a method of mounting the power semiconductor module to a heat sink.

FIG. 17 illustrates an embodiment of a method of mounting the power semiconductor module 100 to a heat sink 700. The heat sink 700 may be air or liquid cooled. The power semiconductor module 100 may be mounted to the circuit board 200 before or after the module 100 is mounted to the heat sink 700. When mounted beforehand, the circuit board 200 may be provided with additional openings to allow access for the heat sink fasteners 702.

Mounting more than one power semiconductor module 100 to the same heat sink 700 exasperates the high pin tolerance issue, since the same circuit board 200 is mounted to the opposite side of the modules 100 as the heat sink 700. The holes 704 in the module 100 for receiving the heat sink fasteners 702 are larger than the diameter of the fasteners 702, which allows for some movement of the modules 100 on the heat sink 700 prior to being secured in place. This makes circuit board press fitting more difficult, if the modules 100 are not mounted accurately on the heat sink 700.

Before the power semiconductor module 100 is mounted to the heat sink 700 using the heat sink fasteners 702, the mounting position of the power semiconductor module 100 to the heat sink 700 is adjusted based on the positional offset encoded on an exterior surface of the module 100 to improve mounting accuracy for the circuit board 200. This may involve imaging equipment 704 reading and deciphering the positional offset encoded on the exterior surface of the module 100, e.g., as described above in connection with FIG. 16. The mounting position of the power semiconductor module 100 to the heat sink 700 may be adjusted based on the positional offset in the X direction, Y direction and/or along a rotational axis 706 that is parallel to the pressing direction Z.

As previously explained herein, a best fit calculation may be used to determine the positional offset for the power semiconductor module 100. In this case, the data points are the positional deviations of the individual module pins 112 and the fitting criteria ensures all module pins 112 are within the respective target positions.

Figure 18:
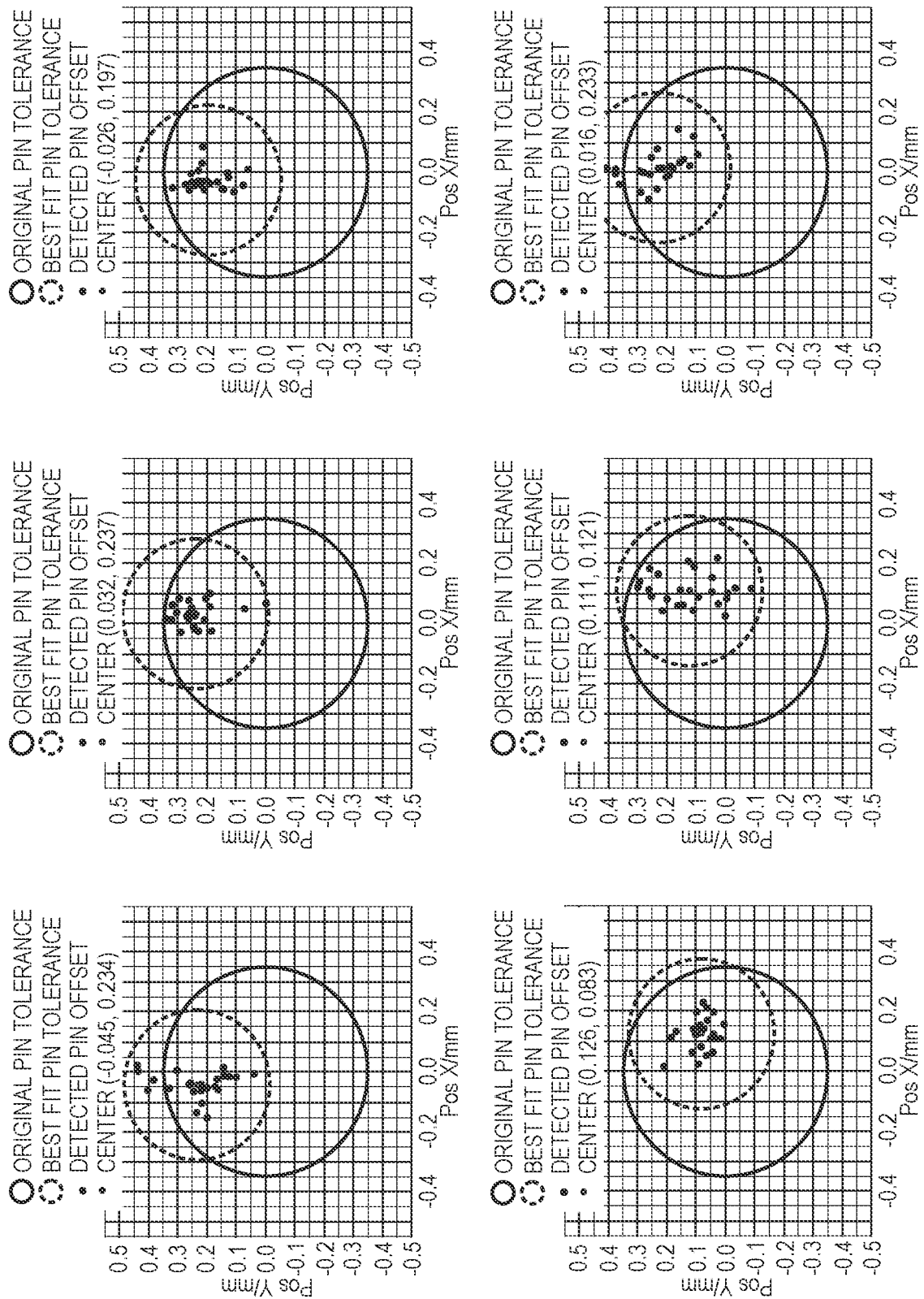
FIG. 18 illustrates six (6) different Gaussian geometric best fit examples for the module positional offset, calculated based on the positional deviations (offsets) of the individual module pins.

FIG. 18 illustrates six (6) different Gaussian geometric best fit examples for the module positional offset, calculated based on the positional deviations (offsets) of the individual pins 112. A geometric center of gravity may be calculated based on the positional deviations of the pins 112, e.g., based on coordinate shifts in the X and Y directions. In another embodiment, the positional offset for the power semiconductor module 100 is determined by applying a least squares regression analysis to the positional deviations of the pins 112. In another embodiment, the positional offset for the power semiconductor module 100 is determined by calculating the positional offset based on the maximum and the minimum positional deviations of the pins 112. In each case, the overall pin tolerance for the power semiconductor module 100 is reduced using the best fit approach which in turn increases overall module pin alignment accuracy relative to the circuit board 200.

Figure 19:
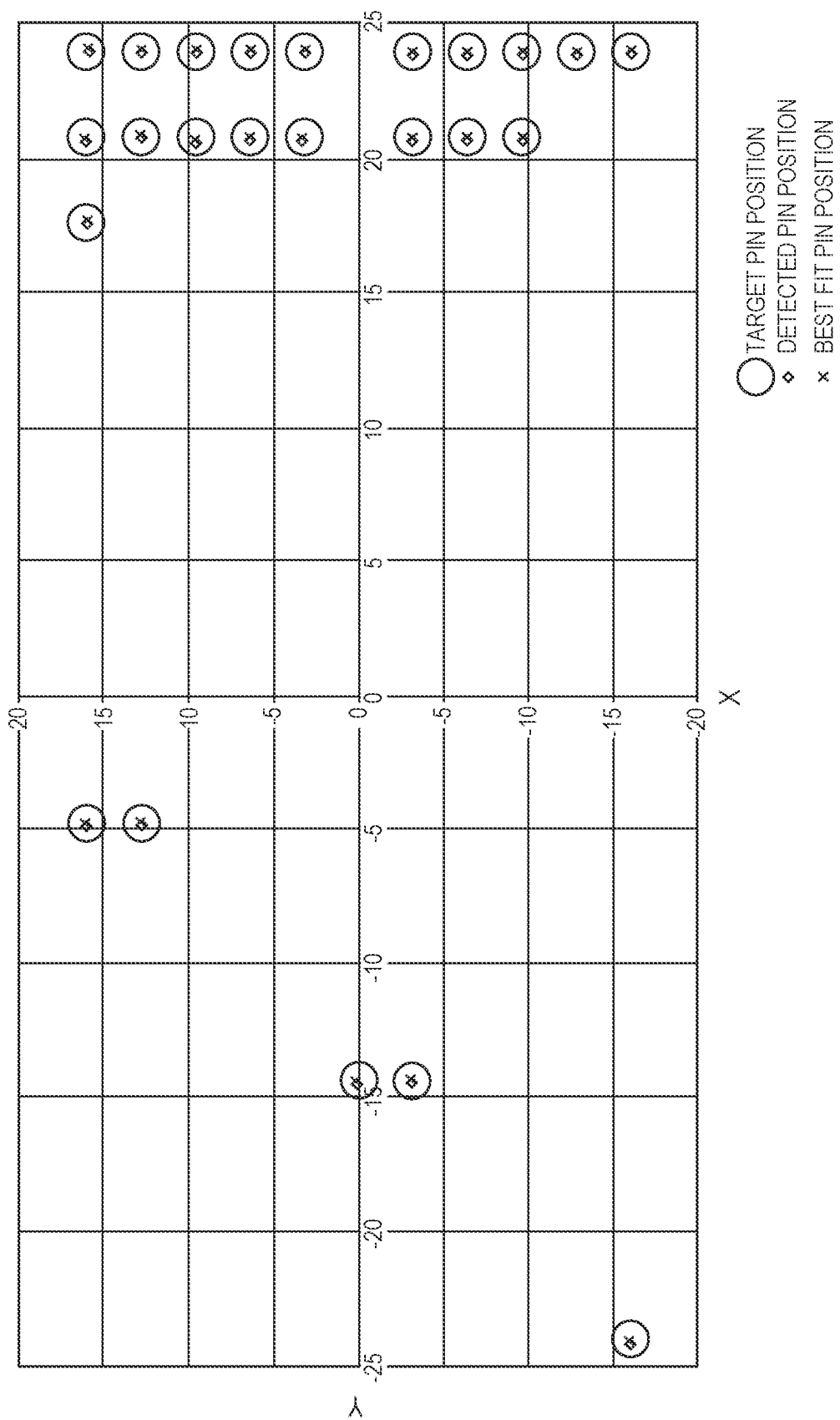
FIG. 19 illustrates another Gaussian best fit example that uses the positional deviations (offsets) of the individual module pins 112 to determine the positional offset for the power semiconductor module.

FIG. 19 illustrates another Gaussian best fit example that uses the positional deviations (offsets) of the individual pins 112 to determine the positional offset for the power semiconductor module 100. According to this embodiment, best fit adjustment of the pin tip positions are calculated according to each coordinate center of gravity.

Although the present disclosure is not so limited, the following numbered examples demonstrate one or more aspects of the disclosure.

Example 1. A method of increasing overall pin alignment accuracy for a power semiconductor module having a plurality of pins protruding from a housing of the power semiconductor module, the method comprising: determining a positional deviation of each pin of the plurality of pins from a respective target position in a coordinate system; determining a positional offset for the power semiconductor module based on the positional deviations of the pins, the positional offset reducing overall misalignment between the plurality of pins and the target positions; and encoding the positional offset on an exposed surface of the power semiconductor module.

Example 2. The method of example 1, wherein determining the positional offset for the power semiconductor module comprises: applying a least squares regression analysis to the positional deviations of the pins.

Example 3. The method of example 1, wherein determining the positional offset for the power semiconductor module comprises: calculating the positional offset based on the maximum and the minimum positional deviations of the pins.

Example 4. The method of example 1, wherein determining the positional offset for the power semiconductor module comprises: calculating a geometric center of gravity based on the positional deviations of the pins.

Example 5. The method of any of examples 1 through 4, wherein the coordinate system is a Cartesian coordinate system and wherein determining the positional deviation of each pin comprises: calculating an X offset for each pin having a position that differs from the corresponding target position in the X axis of the Cartesian coordinate system; and calculating a Y offset for each pin having a position that differs from the corresponding target position in the Y axis of the Cartesian coordinate system.

Example 6. The method of example 5, wherein determining the positional offset for the power semiconductor module comprises: calculating the positional offset based on the X and Y offsets calculated for the pins.

Example 7. The method of any of examples 1 through 6, wherein encoding the positional offset on the exposed surface of the power semiconductor module comprises: marking one or more fiducial marks indicative of the positional offset on the exposed surface of the power semiconductor module.

Example 8. The method of any of examples 1 through 6, wherein encoding the positional offset on the exposed surface of the power semiconductor module comprises: marking a barcode indicative of the positional offset on the exposed surface of the power semiconductor module.

Example 9. The method of any of examples 1 through 8, wherein encoding the positional offset on the exposed surface of the power semiconductor module comprises: laser marking one or more fiducial marks or a barcode indicative of the positional offset on the exposed surface of the power semiconductor module.

Example 10. The method of any of examples 1 through 8, wherein encoding the positional offset on the exposed surface of the power semiconductor module comprises: ink jet printing one or more fiducial marks or a barcode indicative of the positional offset on the exposed surface of the power semiconductor module.

Example 11. The method of any of examples 1 through 8, wherein encoding the positional offset on the exposed surface of the power semiconductor module comprises: scribing one or more fiducial marks or a barcode indicative of the positional offset on the exposed surface of the power semiconductor module.

Example 12. The method of any of examples 1 through 11, wherein encoding the positional offset on the exposed surface of the power semiconductor module comprises: encoding the positional offset on an exposed surface of the housing.

Example 13. The method of any of examples 1 through 11, wherein encoding the positional offset on the exposed surface of the power semiconductor module comprises: encoding the positional offset on an exposed surface of a substrate of the power semiconductor module to which the housing is secured.

Example 14. The method of any of examples 1 through 11, wherein encoding the positional offset on the exposed surface of the power semiconductor module comprises: encoding the positional offset on an exposed surface of a metallic component of the power semiconductor module.

Example 15. The method of any of examples 1 through 14, further comprising: deciphering the positional offset encoded on the exposed surface of the power semiconductor module; securing the power semiconductor module by automated equipment; adjusting a pressing position of the automated equipment in relation to a circuit board, based on the deciphered positional offset; and after adjusting the pressing position, pressing the plurality of pins into respective openings in the circuit board via the automated equipment.

Example 16. The method of any of examples 1 through 15, further comprising: adjusting a mounting position of the power semiconductor module to a heat sink based on the positional offset.

Example 17. A method of mounting a power semiconductor module having a plurality of pins protruding from a housing of the power semiconductor module, the method comprising: deciphering a positional offset encoded on the exposed surface of the power semiconductor module, the positional offset reducing overall misalignment between the plurality of pins and target positions for the pins; securing the power semiconductor module by automated equipment; adjusting a pressing position of the automated equipment in relation to a circuit board, based on the deciphered positional offset; and after adjusting the pressing position, pressing the plurality of pins into respective openings in the circuit board via the automated equipment.

Example 18. A power semiconductor module, comprising: a plurality of power semiconductor dies attached to a substrate; a housing secured to the substrate and enclosing the plurality of power semiconductor dies; a plurality of pins protruding from the housing; and a positional offset encoded on the exposed surface of the power semiconductor module, the positional offset reducing overall misalignment between the plurality of pins and target positions for the pins.

Example 19. The power semiconductor module of example 18, wherein the positional offset encoded on the exposed surface of the power semiconductor module comprises one or more fiducial marks indicative of the positional offset.

Example 20. The power semiconductor module of example 18, wherein the positional offset encoded on the exposed surface of the power semiconductor module comprises a barcode indicative of the positional offset.

Example 21. The power semiconductor module of example 20, wherein the barcode relates the positional offset to a plurality of mounting regions of the housing that are configured to enable mounting of the housing to a body.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of increasing overall pin alignment accuracy for a power semiconductor module having a plurality of pins protruding from a housing of the power semiconductor module, the method comprising:
    determining a positional deviation of each pin of the plurality of pins from a respective target position in a coordinate system;
    determining a positional offset for the power semiconductor module based on the positional deviations of the pins, the positional offset reducing overall misalignment between the plurality of pins and the target positions; and
    encoding the positional offset on an exposed surface of the power semiconductor module.

2. The method of claim 1, wherein determining the positional offset for the power semiconductor module comprises:
    applying a least squares regression analysis to the positional deviations of the pins.

3. The method of claim 1, wherein determining the positional offset for the power semiconductor module comprises:
    calculating the positional offset based on the maximum and the minimum positional deviations of the pins.

4. The method of claim 1, wherein determining the positional offset for the power semiconductor module comprises:
    calculating a geometric center of gravity based on the positional deviations of the pins.

5. The method of claim 1, wherein the coordinate system is a Cartesian coordinate system and wherein determining the positional deviation of each pin comprises:
    calculating an X offset for each pin having a position that differs from the corresponding target position in the X axis of the Cartesian coordinate system; and
    calculating a Y offset for each pin having a position that differs from the corresponding target position in the Y axis of the Cartesian coordinate system.

6. The method of claim 5, wherein determining the positional offset for the power semiconductor module comprises:
    calculating the positional offset based on the X and Y offsets calculated for the pins.

7. The method of claim 1, wherein encoding the positional offset on the exposed surface of the power semiconductor module comprises:
    marking one or more fiducial marks indicative of the positional offset on the exposed surface of the power semiconductor module.

8. The method of claim 1, wherein encoding the positional offset on the exposed surface of the power semiconductor module comprises:

marking a barcode indicative of the positional offset on the exposed surface of the power semiconductor module.

9. The method of claim 1, wherein encoding the positional offset on the exposed surface of the power semiconductor module comprises:
laser marking one or more fiducial marks or a barcode indicative of the positional offset on the exposed surface of the power semiconductor module.

10. The method of claim 1, wherein encoding the positional offset on the exposed surface of the power semiconductor module comprises:
ink jet printing one or more fiducial marks or a barcode indicative of the positional offset on the exposed surface of the power semiconductor module.

11. The method of claim 1, wherein encoding the positional offset on the exposed surface of the power semiconductor module comprises:
scribing one or more fiducial marks or a barcode indicative of the positional offset on the exposed surface of the power semiconductor module.

12. The method of claim 1, wherein encoding the positional offset on the exposed surface of the power semiconductor module comprises:
encoding the positional offset on an exposed surface of the housing.

13. The method of claim 1, wherein encoding the positional offset on the exposed surface of the power semiconductor module comprises:
encoding the positional offset on an exposed surface of a substrate of the power semiconductor module to which the housing is secured.

14. The method of claim 1, wherein encoding the positional offset on the exposed surface of the power semiconductor module comprises:
encoding the positional offset on an exposed surface of a metallic component of the power semiconductor module.

15. The method of claim 1, further comprising:
deciphering the positional offset encoded on the exposed surface of the power semiconductor module;
securing the power semiconductor module by automated equipment;
adjusting a pressing position of the automated equipment in relation to a circuit board, based on the deciphered positional offset; and
after adjusting the pressing position, pressing the plurality of pins into respective openings in the circuit board via the automated equipment.

16. The method of claim 1, further comprising:
adjusting a mounting position of the power semiconductor module to a heat sink based on the positional offset.

17. A method of mounting a power semiconductor module having a plurality of pins protruding from a housing of the power semiconductor module, the method comprising:
deciphering a positional offset encoded on the exposed surface of the power semiconductor module, the positional offset reducing overall misalignment between the plurality of pins and target positions for the pins;
securing the power semiconductor module by automated equipment;
adjusting a pressing position of the automated equipment in relation to a circuit board, based on the deciphered positional offset; and
after adjusting the pressing position, pressing the plurality of pins into respective openings in the circuit board via the automated equipment.

18. A power semiconductor module, comprising:
a plurality of power semiconductor dies attached to a substrate;
a housing secured to the substrate and enclosing the plurality of power semiconductor dies;
a plurality of pins protruding from the housing; and
a positional offset encoded on the exposed surface of the power semiconductor module, the positional offset reducing overall misalignment between the plurality of pins and target positions for the pins.

19. The power semiconductor module of claim 18, wherein the positional offset encoded on the exposed surface of the power semiconductor module comprises one or more fiducial marks indicative of the positional offset.

20. The power semiconductor module of claim 18, wherein the positional offset encoded on the exposed surface of the power semiconductor module comprises a barcode indicative of the positional offset.

21. The power semiconductor module of claim 20, wherein the barcode relates the positional offset to a plurality of mounting regions of the housing that are configured to enable mounting of the housing to a body.

* * * * *